(12) United States Patent
Nishida et al.

(10) Patent No.: US 6,714,098 B2
(45) Date of Patent: Mar. 30, 2004

(54) SAW ANTENNA DUPLEXER HAVING A PHASE SHIFTER WITH LESS THAN 50 OHM CHARACTERISTIC IMPEDANCE

(75) Inventors: Kazushi Nishida, Osaka (JP); Katsuya Fujii, Osaka (JP); Ichiro Kameyama, Osaka (JP); Toru Sakuragawa, Osaka (JP); Hiroshi Fujinaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 249 days.

(21) Appl. No.: 09/914,263
(22) PCT Filed: Dec. 21, 2000
(86) PCT No.: PCT/JP00/09075
§ 371 (c)(1), (2), (4) Date: Oct. 19, 2001
(87) PCT Pub. No.: WO01/48917
PCT Pub. Date: Jul. 5, 2001

(65) Prior Publication Data
US 2003/0137364 A1 Jul. 24, 2003

(30) Foreign Application Priority Data
Dec. 24, 1999 (JP) .......................... 11/367178

(51) Int. Cl.[7] .................................................. H03H 9/72
(52) U.S. Cl. ........................ 333/133; 333/193; 455/78
(58) Field of Search .................. 333/133, 193–196; 455/78

(56) References Cited

U.S. PATENT DOCUMENTS 6,445,261 B1 * 9/2002 Yuda et al. ................. 333/133

FOREIGN PATENT DOCUMENTS

WO    WO 99/60700    * 11/1999

OTHER PUBLICATIONS

Kamogawa et al.; "High Isolation SAW Antenna Duplexer Modules"; *IEEE 2001 Ultrasonics Symposium;* Atlanta, GA, Oct. 7–10, 2001, vol. 1, pp. 309–314.*

Ikata et al.; "A Design of Antenna Duplexer Using Ladder Type SAW Filters"; *1998 IEEE Ultrasonics Symposium Proceedings,* Oct. 1998, pp. 1–4.

Dai 26 kai EM Symposim Yokoushu, (May 1997), EIIJ, pp. 91–100, "4.4.2 Kypoushin Shuha Suusa (Frs–fap) no Chousei", lines 1–3.

* cited by examiner

*Primary Examiner*—Barbara Summons
(74) *Attorney, Agent, or Firm*—Wenderoth, Lind & Ponack, L.L.P.

(57) ABSTRACT

An antenna duplexer capable of optimally decreasing the insertion loss and the voltage standing wave ratio (VSWR) at a center frequency and its vicinity in the pass band in transmitter-band of the device. The output port of transmitter surface-acoustic-wave (SAW) filter (11) is electrically connected with phase shift circuit (13), to which receiver SAW filter (12) is also electrically connected. The transmitter and receiver SAW filters have different pass bands and attenuate the other pass band with each other. Phase shift circuit (13) shifts the phase of receiver SAW filter (12) in the transmitter-band. In addition, phase shift circuit (13) has the characteristic impedance in which the magnitude of the reflection coefficient at the center frequency in the transmitter-band of receiver SAW filter (12) is to be not less than 0.8 and the phase angle of reflection coefficient at the center frequency in the transmitter-band of receiver SAW filter (12) takes the range from 0° to 45°.

5 Claims, 6 Drawing Sheets

SAW ANTENNA DUPLEXER HAVING A PHASE SHIFTER WITH LESS THAN 50 OHM CHARACTERISTIC IMPEDANCE

FIELD OF THE INVENTION

The present invention relates to an antenna duplexer used for mobile communication equipment.

BACKGROUND OF THE INVENTION

In the prior art antenna duplexer, a transmitter surface-acoustic-wave filter is connected with a receiver surface-acoustic-wave filter via a phase shift circuit in the package of the device.

The phase shift circuit can shift the phase of the transmitter-band for the receiver surface-acoustic-wave filter. Furthermore, the phase shift circuit has the phase angle and the characteristic impedance so that the magnitude of the reflection coefficient at a center frequency in the transmitter-band of receiver SAW filter is to be equal to 0.8 or greater and the phase angle of reflection coefficient at a center frequency in the transmitter-band is to be approximately 0°. The phase shift circuit has the characteristic impedance of about 50 ohms.

Generally, the receiver surface-acoustic-wave filter has, within its pass band, capacitive impedance of less than 50 ohms. Therefore, in the structure above, it is difficult to realize the impedance matching of 50 ohms in both the transmitter-band and the receiver-band, with insertion loss and voltage standing wave ratio (hereinafter referred to as VSWR) increased.

SUMMARY OF THE INVENTION

It is the object of the present invention to provide an antenna duplexer having an optimum impedance matching in the transmitter-band and the receiver-band at the antenna port, as well as having improved VSWR characteristics with minimized insertion loss in its pass band.

The antenna duplexer of the present invention addresses the conventional problems, and includes: i) a transmitter surface-acoustic-wave filter; ii) a phase shift circuit whose one port is electrically connected with the output port of the transmitter surface-acoustic-wave filter; and iii) a receiver surface-acoustic-wave filter whose input port is electrically connected with the other port of the phase shift circuit.

The transmitter and receiver surface-acoustic-wave filters have different pass bands in frequency and attenuate the other pass band with each other. The phase shift circuit can at least shift the phase of the receiver surface-acoustic-wave filter in its transmitter-band.

The phase shift circuit can shift the phase of the receiver surface-acoustic-wave filter in its transmitter-band, as well as can control the reflection coefficient at a center frequency in the transmitter-band of the receiver surface-acoustic-wave filter so that the magnitude of the reflection coefficient is to be equal to 0.8 or greater and the phase angle of the reflection coefficient is to be 0° through 45°.

Accordingly this has the same advantage as adding inductive components, in parallel with the antenna port, in the pass band of the transmitter surface-acoustic-wave filter having capacitive impedance of less-than-50 ohms. This allows the impedance in the transmitter-band at the antenna port of the antenna duplexer to match closer to 50 ohms.

According to the present invention, it is thus possible to obtain an antenna duplexer having improved VSWR characteristics and minimize insertion loss in its transmitter-band.

In an embodiment of the present invention, the antenna duplexer contains a transmitter surface-acoustic-wave filter, a phase shift circuit whose one port is electrically connected with the output port of the transmitter surface-acoustic-wave filter, and a receiver surface-acoustic-wave filter whose input port is electrically connected with the other port of the phase shift circuit.

The transmitter and receiver surface-acoustic-wave filters have different pass bands, and attenuate the other pass band with each other. The phase shift circuit can at least shift the phase of the receiver surface-acoustic-wave filter in its transmitter-band.

The phase shift circuit shifts the phase of the receiver surface-acoustic-wave filter in its transmitter-band and has a phase angle and a characteristic impedance so that the magnitude of the reflection coefficient at a center frequency in transmitter-band of receiver surface-acoustic-wave filter is to be equal to 0.8 or greater and the phase angle of the reflection coefficient at a center frequency in transmitter-band of receiver surface-acoustic-wave filter is to be 0° through 45°.

Accordingly, compared with a conventional antenna duplexer, such structured antenna duplexer can easily provide the impedance in the transmitter-band at the antenna port of the device so as to match closer to 50 ohms. That is, the device described above has improved VSWR characteristics and minimized insertion loss in transmitter-band.

In another embodiment of the present invention, in addition to the structure described in the immediately preceding structure, the antenna duplexer includes the phase shift circuit having less-than-50 ohm characteristic impedance.

Since the receiver surface-acoustic-wave filter has, in its pass band, impedance of less than 50 ohms, the phase shift circuit can provide the impedance in the receiver-band at the antenna port of the antenna duplexer to match closer to 50 ohms.

The antenna duplexer has therefore improved VSWR characteristics and minimized insertion loss in the both transmitter-band and receiver-band.

According to still another embodiment of the present invention, in addition to the structure introduced in the immediately preceding structure, the antenna duplexer includes the phase shift circuit whose characteristic impedance takes the range of 42±8 ohms—not including 50 ohms. The antenna duplexer has therefore improved VSWR characteristics and minimized insertion loss in the both transmitter-band and receiver-band.

According to yet another embodiment of the present invention, in addition to the initially described structure, the antenna duplexer has the transmitter surface-acoustic-wave filter formed of a ladder-type filter, in which the resonance frequency of a serial-branch surface-acoustic-wave (hereinafter referred to as SAW) resonator is higher than the anti-resonance frequency of a parallel-branch SAW resonator.

With the antenna duplexer, broadband filter characteristics can be obtained, with the VSWR characteristics and insertion loss in the transmitter-band maintained at an adequate level.

According to another embodiment of the present invention, in addition to the initially described structure, the antenna duplexer contains the phase shift circuit whose phase angle takes the range of 90±10°. The antenna duplexer can therefore provide the transmitting band at the antenna port with the impedance matching of 50 ohms, enhancing the VSWR characteristics on the transmitter side, with insertion loss minimized.

According to still another embodiment of the present invention, in addition to the structure introduced in the immediately preceding structure, the antenna duplexer includes the phase shift circuit whose characteristic impedance takes the range of 42±8 ohms—not including 50 ohms, and whose phase angle takes the range of 90±10°. This realizes the impedance matching of 50 ohms in the receiver-band at the antenna port of the antenna duplexer. The antenna duplexer has therefore improved the VSWR characteristics and minimized insertion loss in the receiver-band, as well as in the transmitter-band.

According to still another embodiment of the present invention, like the structure described immediately above, the antenna duplexer includes: i) a transmitter SAW filter; ii) a phase shift circuit whose one port is electrically connected with the output port of the transmitter SAW filter; and iii) a receiver SAW filter whose input port is electrically connected with the other port of the phase shift circuit.

The transmitter and receiver SAW filters have different pass bands and attenuate the other pass band with each other. The phase shift circuit can shift the phase of the receiver SAW filter in its transmitter-band. The phase shift circuit has less-than-50 ohm characteristic impedance.

This realizes impedance matching of 50 ohms in the receiver-bandat the antenna port of the antenna duplexer.

The antenna duplexer has therefore improved the VSWR characteristics and minimized insertion loss in the receiver-band.

According to yet another embodiment of the present invention, in addition to the structure introduced in the immediately preceding structure, the antenna duplexer includes the phase shift circuit whose characteristic impedance takes the range of 42±8 ohms—not including 50 ohms. This realizes impedance matching of 50 ohms in the receiver-band at antenna port of the antenna duplexer. The antenna duplexer has therefore improved the VSWR characteristics and minimized insertion loss in the receiver-band.

DESCRIPTION OF THE PREFERRED EMBODIMENTS

First Preferred Embodiment

Figure 1:
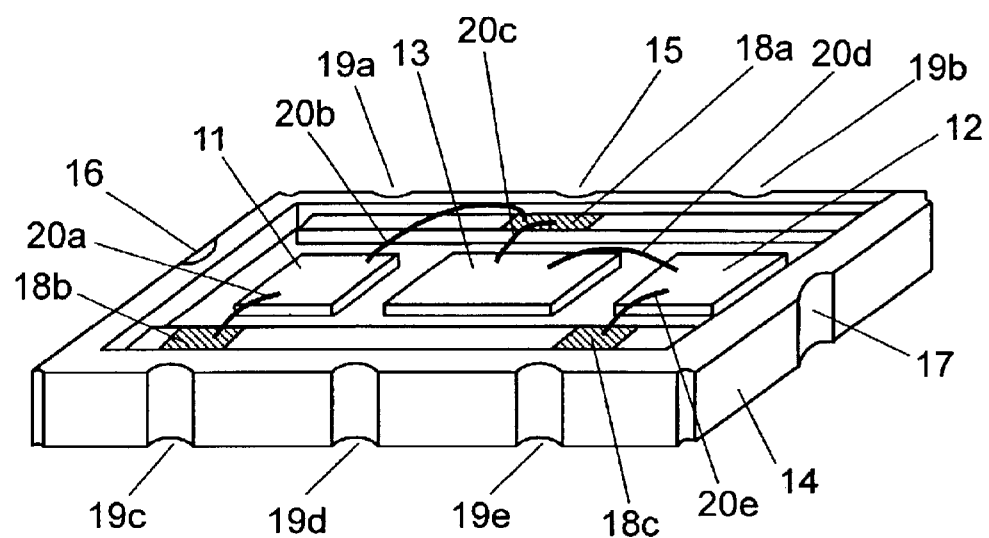
FIG. 1 is a perspective view of the antenna duplexer in accordance with an embodiment of the present invention.

FIG. 1 is a perspective view of the antenna duplexer in accordance with the first preferred embodiment of the present invention.

The antenna duplexer includes transmitter SAW filter 11 and receiver SAW filter 12 that are formed of inter-digital transducer on a piezoelectric substrate, and phase shift circuit 13. All of them are accommodated in package 14. Antenna terminal 15, transmitter terminal 16, receiver terminal 17, and ground terminal 19a through 19e are disposed around the package 14. On the other hand, within package 14, connecting pads 18a through 18c are arranged. Connecting pads 18a, 18b, and 18c are connected to antenna terminal 15, transmitter terminal 16, and receiver terminal 17, respectively.

Each of transmitter SAW filter 11, receiver SAW filter 12, and phase shift circuit 13 has two connecting pads. Bonding wire 20a connects one pad of transmitter SAW filter 11 with connecting pad 18b, while bonding wire 20b connects the other pad of filter 11 with connecting pad 18a.

Similarly, bonding wire 20e connects one pad of receiver SAW filter 12 with connecting pad 18c; bonding wire 20d connects the other pad of filter 12 with one pad of phase shift circuit 13; and bonding wire 20c connects the other pad of phase shift circuit 13 with connecting pad 18a.

Figure 2:
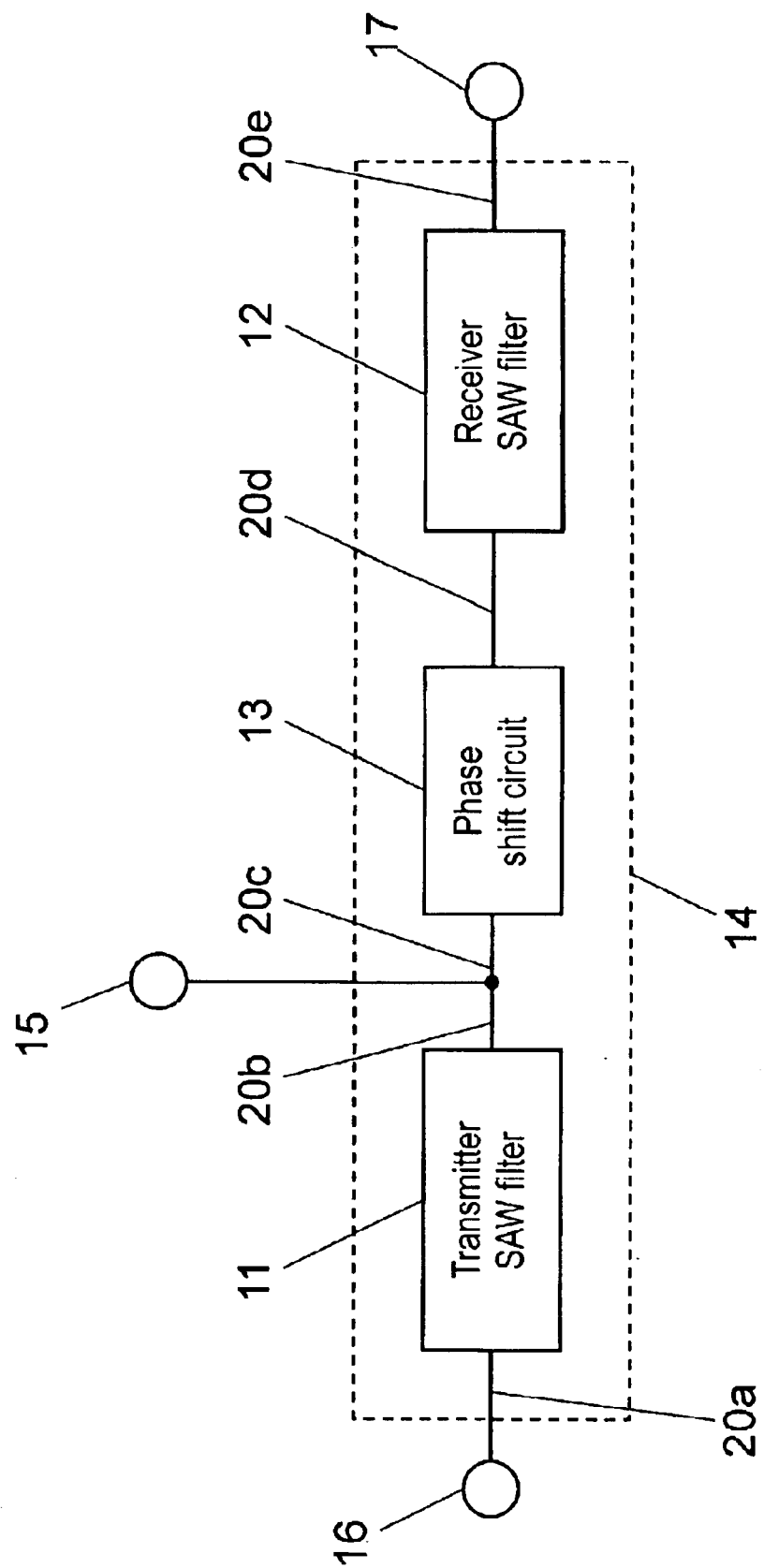
FIG. 2 shows the circuit of the antenna duplexer in accordance with an embodiment of the present invention.

FIG. 2 shows the circuit of the antenna duplexer, in which the components corresponding to those of FIG. 1 are identified with the same references.

Phase shift circuit 13 can at least shift the phase of the transmitter-band in receiver SAW filter 12. Phase shift circuit 13 has a less-than-50 ohm characteristic impedance, more specifically, takes the range of 42±8 ohms—not including 50 ohms.

Figure 3:
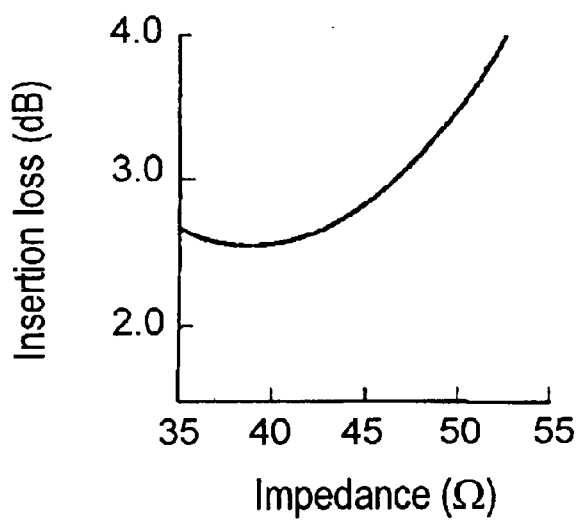
FIG. 3 shows the relation between the impedance of a phase shift circuit and insertion loss occurred in the antenna duplexer in the proximity of the center frequency in the receiver-band in accordance with an embodiment of the present invention.
Figure 4:
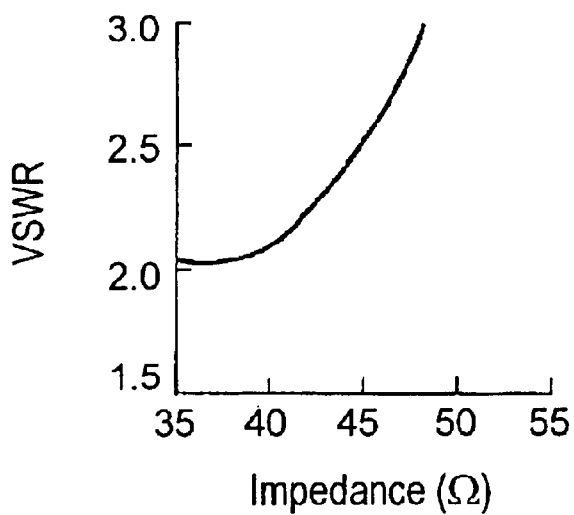
FIG. 4 shows the relation between the impedance of a phase shift circuit and the VSWR occurred in the antenna duplexer in the proximity of the center frequency in the receiver-band in accordance with an embodiment of the present invention.

As is apparent from FIGS. 3 and 4, the insertion loss and the VSWR in the receiver band decrease as the characteristic impedance of phase shift circuit 13 decreases from 50 ohms. But still, too-much-decreased characteristic impedance adversely affects on insertion loss and the VSWR in the transmitting characteristics. It is therefore preferable that the characteristic impedance of phase shift circuit 13 should take 42±8 ohms—not including 50 ohms.

Second Preferred Embodiment

As the structure of the antenna duplexer of the embodiment is the same in appearance as that of the first preferred embodiment.

Here will be described the characteristics of the antenna duplexer, focused on differences from the device explained in the first preferred embodiment, referring to FIGS. 1 and 2.

Transmitter SAW filter 11 is a ladder-type filter, in which the resonance frequency of the serial-branch surface acoustic wave (hereinafter SAW) resonator is set to be higher than the anti-resonance frequency of the parallel-branch SAW resonator.

Phase shift circuit 13 can shift the phase of receiver SAW filter 12 in the transmitter-band. In addition, phase shift circuit 13 has the phase angle and the characteristic impedance so that the magnitude of the reflection coefficient at a center frequency in the transmitter-band of receiver SAW filter 12 is to be equal to 0.8 or greater and the phase angle of reflection coefficient at a center frequency in the transmitter-band is to be from 0° to 45°.

More specifically, the phase angle of phase shift circuit 13 is determined to be 90±10° and the characteristic impedance is determined to be 42±8 ohms—not including 50 ohms.

With the structure above, like the case described in the first preferred embodiment referencing to FIGS. 3 and 4, the insertion loss and the VSWR in the proximity of the center frequency of receiver SAW filter 12 decrease with decreasing the characteristic impedance of phase shift circuit 13 away from 50 ohms. However still, too-much-decreased characteristic impedance adversely affects on insertion loss and the VSWR on the transmitter-band.

It is therefore preferable that the characteristic impedance of phase shift circuit 13 should take 42±8 ohms—not including 50 ohms. Employing phase shift circuit 13 whose phase angle ranges 80° through 100° can keep the magnitude of reflection coefficient at a center frequency in the transmitter-band of receiver SAW filter to be 0.8 or greater, and the phase angle of reflection coefficient at a center frequency in the transmitter-band of receiver SAW filter to take the range of 0° through 45°.

Figure 5:
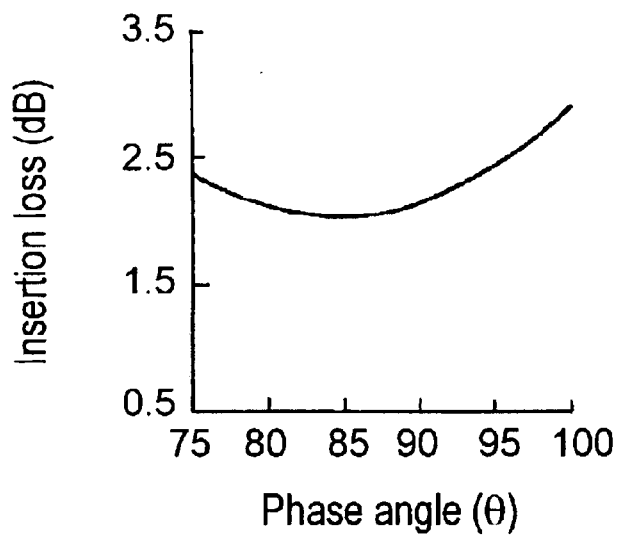
FIG. 5 shows the relation between the phase angle of the phase shift circuit and insertion loss occurred in the antenna duplexer in the proximity of the center frequency in the transmitter-band in accordance with an embodiment of the present invention.
Figure 6:
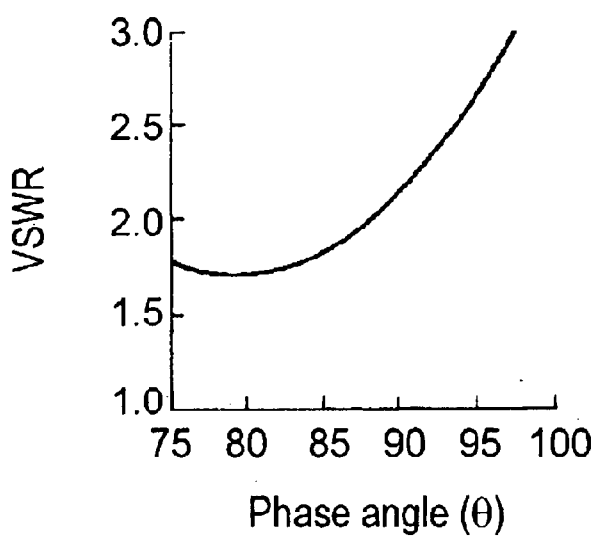
FIG. 6 shows the relation between the phase angle of a phase shift circuit and the VSWR occurred in the antenna duplexer in the proximity of the center frequency in transmitter-band in accordance with an embodiment of the present invention.

As shown in FIGS. 5 and 6, this results in properly decreasing the insertion loss and the VSWR in the transmitter-band of the antenna duplexer.

In this way, such a well-adjusted antenna duplexer enables to suppress the insertion loss and the VSWR in both transmitter- and receiver-band of the device.

In the two embodiments above, each explanation is given in the case that the whole components—transmitter SAW filter 11, receiver SAW filter 12, and phase shift circuit 13—are accommodated in package 14. When employing a phase shift circuit-built-in package, it is not necessary to use phase shift circuit 13, with the entire structure downsized.

Transmitter SAW filter 11, receiver SAW filter 12, and phase shift circuit 13 are not necessarily housed in a single package.

Furthermore, discrete parts, instead of phase shift circuit 13, may form the phase shift circuit. In this case, the structure will be the same as shown in FIG. 7.

Figure 7:
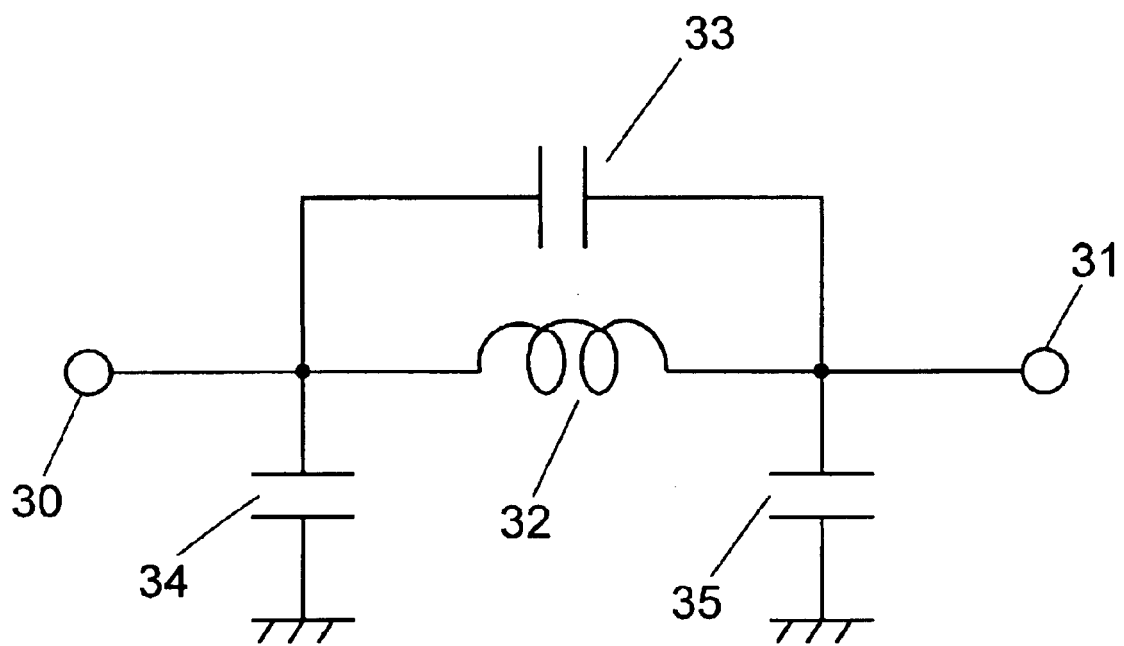
FIG. 7 shows the circuit of the phase shift circuit in accordance with another embodiment of the present invention.
Figure 8:
FIG. 8 shows a conventional SAW filter.

In FIG. 7, inductance element 32 and coupling capacitance 33 have a parallel connection with the serial-branch between input port 30 and output port 31 of the phase shift circuit. Furthermore, capacitance element 34 is connected between the input port 30 and the parallel circuit formed by element 32 and capacitance 33. Similarly, capacitance element 35 is connected between the parallel circuit and output port 31. Capacitance elements 34 and 35 have a grounded-end.

INDUSTRIAL APPLICABILITY

As described above, according to the antenna duplexer of the present invention, the insertion loss and the VSWR can be properly minimized at each center frequency and its vicinity in the both transmitter-band and receiver-band.

What is claimed is:

1. An antenna duplexer comprising:
   a transmitter surface acoustic wave (SAW) filter having an output port;
   a phase shift circuit having a first port and a second port, said first port being electrically connected with said output port of said transmitter SAW filter; and
   a receiver SAW filter having an input port that is electrically connected with said second port of said phase shift circuit,
   wherein said transmitter and said receiver SAW filters have different frequency bands, providing attenuation with each other,
   wherein said phase shift circuit is operable to shift a phase of said receiver SAW filter in its transmitter-band and has a phase angle and a characteristic impedance with which a magnitude of a reflection coefficient at a center frequency in the transmitter-band of said receiver SAW filter is to be not less than 0.8 and the phase angle of reflection coefficient at a center frequency in the transmitter-band of said receiver SAW filter is to be from 0° to 45°, and
   wherein said phase shift circuit has a less-than-50 ohm characteristic impedance.

2. The antenna duplexer of claim 1, wherein the characteristic impedance of said phase shift circuit is 42±8 ohms excluding 50 ohms.

3. An antenna duplexer comprising:
   a transmitter surface acoustic wave (SAW) filter having an output port;
   a phase shift circuit having a first port and a second port, said first port being electrically connected with said output port of said transmitter SAW filter; and
   a receiver SAW filter having an input port that is electrically connected with said second port of said phase shift circuit,
   wherein said transmitter and said receiver SAW filters have different frequency bands, providing attenuation with each other,
   wherein said phase shift circuit is operable to shift a phase of said receiver SAW filter in its transmitter-band and has a phase angle and a characteristic impedance with which a magnitude of a reflection coefficient at a center frequency in the transmitter-band of said receiver SAW filter is to be not less than 0.8 and the phase angle of reflection coefficient at a center frequency in the transmitter-band of said receiver SAW filter is to be from 0° to 45°, and
   wherein the characteristic impedance of said phase shift circuit is 42±8 ohms excluding 50 ohms, and the phase angle of said phase shift circuit is 90±10°.

4. An antenna duplexer comprising:
   a transmitter surface acoustic wave (SAW) filter having an output port;
   a phase shift circuit having a first port and a second port, said first port being electrically connected with said output port of said transmitter SAW filter; and
   a receiver SAW filter having an input port that is electrically connected with said second port of said phase shift circuit,
   wherein said transmitter and said receiver SAW filters have different pass bands and attenuate the other pass band with each other, and
   wherein said phase shift circuit is operable to shift a phase of said receiver SAW filter in its transmitter-band and has a less-than-50 ohm characteristic impedance.

5. The antenna duplexer of claim 4, wherein the characteristic impedance of said phase shift circuit is 42±8 ohms excluding 50 ohms.

* * * * *